United States Patent
Shin et al.

[19]

[11] Patent Number: 6,059,168
[45] Date of Patent: May 9, 2000

[54] WIRE BOND APPARATUS AND METHOD THEREOF

[75] Inventors: Young-joo Shin, Seoul; Su-gun Nam, Suwon-si, both of Rep. of Korea

[73] Assignee: Samsung Aerospace Industries, Ltd., Rep. of Korea

[21] Appl. No.: 09/048,543

[22] Filed: Mar. 26, 1998

[51] Int. Cl.[7] .................................................. H01L 21/60
[52] U.S. Cl. ................................................. 228/4.5; 228/9
[58] Field of Search .................................. 228/4.5, 1.1, 9, 228/102, 180.5, 103, 110.1

[56] References Cited

U.S. PATENT DOCUMENTS

| | | | |
|---|---|---|---|
| 3,863,827 | 2/1975 | Foulke et al. | 228/4.5 |
| 4,109,846 | 8/1978 | Pennings et al. | 228/4.5 |
| 4,266,710 | 5/1981 | Bilane et al. | 228/4.5 |
| 4,444,349 | 4/1984 | Bilane et al. | 228/102 |
| 4,597,522 | 7/1986 | Kobayashi | 228/180.5 |
| 5,323,952 | 6/1994 | Kato et al. | 228/102 |
| 5,443,200 | 8/1995 | Arikado | 228/102 |

*Primary Examiner*—Samuel M. Heinrich
*Attorney, Agent, or Firm*—Alston & Bird LLP

[57] ABSTRACT

The present invention provides a wire bonding apparatus for performing a wire bonding operation on a workpiece having a planar upper surface. The wire bonding apparatus includes a capillary for performing wire bonding and a drive unit for positioning the capillary. The wire bonding apparatus also includes a controller that controls the drive unit and the capillary. This controller generates an equation that defines the plane of the workpiece. Further, the controller determines the difference in height between the home position of the capillary and a selected bonding position on the workpiece based on the equation of the plane. The controller also determines a speed profile for moving the wire bonding apparatus toward the selected bonding position. This speed profile divides the difference in height into first and second sections. Preferably, the second section associated with each bonding position has the same heights. The controller further controls the height of the capillary by providing control signals to the drive unit to sequentially move the capillary through the first and second sections, albeit at different speeds. Finally, the controller generates a bond control signal that is provided to the capillary such that the capillary performs the wire bonding operation upon contacting the bonding position.

14 Claims, 5 Drawing Sheets

WIRE BOND APPARATUS AND METHOD THEREOF

RELATED APPLICATIONS

This application claims priority from Korean Patent Application No. 97-11081 that was filed on Mar. 28, 1997, the contents of which are incorporated in their entirety herein.

FIELD OF THE INVENTION

The present invention relates to a wire bonding apparatus and method. In particular, the invention relates to a wire bonding apparatus and method that compensates for differences in bonding heights between bonding positions on a workpiece.

BACKGROUND OF THE INVENTION

In a typical semiconductor manufacturing process, an integrated circuit chip (IC) is initially cut from a wafer, such as a silicon wafer, and is mounted upon the die pad unit of a lead frame. The die pad unit is configured to received the IC and contains electrical leads that extend from the die pad unit to the external portion of the lead frame. A wire bonding operation is then performed on the IC to connect input and output terminals of the IC to the appropriate electrical leads of the lead frame. The IC is next environmentally sealed by use of a ceramic or an epoxy. Finally, the electrical leads that extend to the external portion of the lead frame are trimmed and prepared for connection to a printed circuit board so as to conduct electrical signals between the input and output terminals of the IC and the printed circuit board.

The wire bonding operation is an important step in the semiconductor manufacturing process. In particular, the wire bonding operation requires high precision due to the increasing miniaturization of ICs and the their associated lead frames. With reference to FIG. 6, a wire bonding operation is typically accomplished by placing a workpiece 2 on a heater block 1. As shown, the IC workpiece 2 includes pads 21 and electrical leads 22. A capillary 3 is then lowered to a bonding position on the workpiece and a wire bond is formed.

The operation of the capillary is two-fold. As shown in FIG. 7, the capillary is generally held in a home or initial position above the workpiece prior to the bonding operation. The distance between the home position of the capillary and the workpiece is divided into two sections. The first section is an acceleration/deceleration motion section in which the capillary is driven with an acceleration/deceleration motion. After the capillary has moved through this section, the capillary enters the second or lower section. The second section is also known as the search level since the capillary is moved more slowly through the second section as the capillary prepares to contact the workpiece.

As the capillary enters the second section (or search level), a touch algorithm is input to the drive unit of the capillary such that the capillary moves with a uniform motion until it contacts the workpiece at the bonding position. Once the capillary reaches the bonding position, the uniform motion provides a uniform pressure to the workpiece or the capillary wire bonds the workpiece.

Although a conventional wire bonding apparatus has a high level of precision, problems occur due to manufacturing tolerances of the die pad unit and the IC and also improper placement of the IC upon the die pad unit. With reference to FIG. 6, the pads 21 and electrical leads 22 of the IC workpiece are placed on a heater block 1. As can be seen, the upper surface of the heater block 1 is inclined such that the heights from the capillary to each of the bonding positions Pt1, Pt2, Lt1, and Lt2 have differing lengths.

A conventional wire bonding apparatus generally does not compensate for these differing heights. Instead, conventional systems typically use the same height for the acceleration/deceleration motion section for each bonding position on a workpiece. This use of the same length acceleration/deceleration motion section causes each of the bonding positions to have differing uniform motion sections (or search levels). For instance, in the wire bonding operation shown in FIG. 6, if a acceleration/deceleration motion section is chosen based on the bonding position designated by Pt1, and subsequently used for the remaining bonding positions, the uniform motion sections for the bonding positions designated by Pt2 and Lt2 will have shorter uniform motion sections. Further, the bonding position designated by Lt1 will have a longer uniform motion section.

These difference in the uniform motion sections (or search levels) can degrade the wire bonding operation. For instance, if the uniform motion section becomes very short such as in the case of Pt2 and Lt2, the inertia of the capillary due to the acceleration/deceleration motion may cause the capillary to contact the bonding position with an undesired force or possibly become embedded in the IC at the bonding position. On the other hand, in instances where the uniform motion section is increased as in the case of Lt1, the speed of the capillary may become too slow and thus provide an improper wire bond.

SUMMARY OF THE INVENTION

An object of the present invention is to provide a wire bonding apparatus and method which compensates for variations in the height between the capillary and the plurality of bonding positions upon a workpiece.

Another object of the present invention is to provide a wire bonding apparatus and method for compensating for differences in heights between the capillary and bonding positions on a workpiece such that the uniform motion section (or search level) of all the bonding positions are substantially equal.

Another object of the present invention is to provide a wire bonding apparatus and method that generates an equation representing the plane of the workpiece and that calculates bonding heights for each bonding position based on the generated equation of the plane.

In accordance with the above and other objects of the invention, the present invention provides a wire bonding apparatus for performing a wire bonding operation on a workpiece having a planar upper surface. The wire bonding apparatus comprises wire bonding means, such as a capillary, for performing wire bonds and a drive unit for positioning the wire bonding means. The wire bonding apparatus also includes a controller connected to the drive unit for controlling the drive unit and the wire bonding means.

The controller includes equation generating means that generates an equation which defines the geometric plane of the workpiece. Further, the controller includes height determining means that determines the difference in height between the home position of the wire bonding means and a workpiece at a selected bonding position based on the equation generated by the equation generating means. The controller of the present invention further includes means for determining a speed profile of the wire bonding means based on the difference in height between the selected bonding position and the home position of the wire bonding means. The controller also includes height controlling means for providing control signals in accordance with said speed profile to the drive unit to move the wire bonding means through the distance between the bonding position and home position of the wire bonding means at desired speeds. Finally, the controller includes means for generating a bond control signal and for providing the bond control signal to the wire bonding means such that the wire bonding means performs a wire bonding operation upon contacting the workpiece at the bonding position.

In one embodiment of the invention, the controller further comprises measuring means that measures the difference height between the home or initial position of the wire bonding means and the workpiece at a plurality of measurement positions that have defined coordinates. These heights and the corresponding coordinates of the measurement positions are then used by the equation generating means to generate an equation that defines the plane of the workpiece.

Advantageously, the measuring means provides a control signal to the drive unit to move the wire bonding means downwardly toward respective ones of the measurement positions. The measuring means of this embodiment also includes an encoder that determines the difference in height between the home position of the wire bonding means and each measurement position by measuring the movement of the wire bonding means toward each of the measurement positions.

In a typical embodiment, the means for determining a speed profile of the wire bonding includes a dividing means that divides the height between the home position of the wire bonding means and a selected position to be wire bonded into first and second sections. The first section is usually an acceleration/deceleration motion section, while the second section is a uniform motion section (or search level). As such, the height controlling means preferably provides a first control signal to the drive unit which drives the wire bonding means through the acceleration/deceleration section with an acceleration/deceleration motion. The height controlling means then drives the wire bonding means through the uniform motion section (or search level) with a uniform motion in accordance with the speed profile.

In order to overcome at least some of the shortcomings of conventional wire bonding apparatus, the wire bonding apparatus preferably defines the uniform motion section for each of the bonding positions to be the same such that the wire bonding means is moved with a uniform motion through a uniform motion section of the same length prior to contacting the workpiece at each bonding position. Since the movement of the wire bonding means through the uniform motion section is generally slower and more controlled, the definition of a uniform motion section of the same length for each bonding position insures consistent wire bonding operations and minimizes inadvertent damage to the workpiece. Since each uniform motion section is the same length, any variations in the difference in height between the home position of the wire bonding means and the various wire bonding positions are compensated for by the acceleration/declaration section that can vary in length from bonding position to bonding position.

Similar to the above-described apparatus, the present invention also provides a method for performing a wire bonding operation on a workpiece having a planar upper surface that includes a plurality of bonding positions. This method of the present invention includes the step of determining an equation that defines the plane of the workpiece. The method further includes the step of applying the coordinates of a bonding position to the equation to calculate a difference in height between the bonding position and the initial or home position of the wire bonding means. The wire bonding means is then moved downward toward the bonding position until the workpiece is contacted at which time a wire bonding operation is performed.

The method preferably includes the step of determining a speed profile for the wire bonding means based on the difference in height between the initial or home position of the wire bonding means and a bonding position. In a preferred embodiment, the step of determining a speed profile includes the step of dividing the difference in height between the home position of the wire bonding means and the bonding position into an acceleration/deceleration motion section and a uniform motion section (or search level). Accordingly, the moving step comprises the step of moving the capillary through the acceleration/deceleration motion section with an acceleration/deceleration motion and moving the capillary through the uniform motion section with a uniform motion in accordance with the speed profile. Advantageously, one uniform motion section associated with each bonding position is the same to insure consistency in the wire bonding operations while minimizing any damage to the workpiece.

BRIEF DESCRIPTION OF THE DRAWINGS

The accompanying drawings, which are incorporated in and constitute a part of this specification, illustrate one embodiment of the invention and, together with the description, serve to explain the principles of the invention. In the drawings.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete and will fully convey the scope of the invention to those skilled in the art. Like numbers refer to like elements throughout.

Reference will now be made in detail to advantageous embodiments of the wire bonding apparatus of the present invention, an example of which is illustrated in the accompanying drawings. In this regard, FIG. 1 illustrates a block diagram of a wire bonding apparatus according to one embodiment of the present invention.

Figure 1:
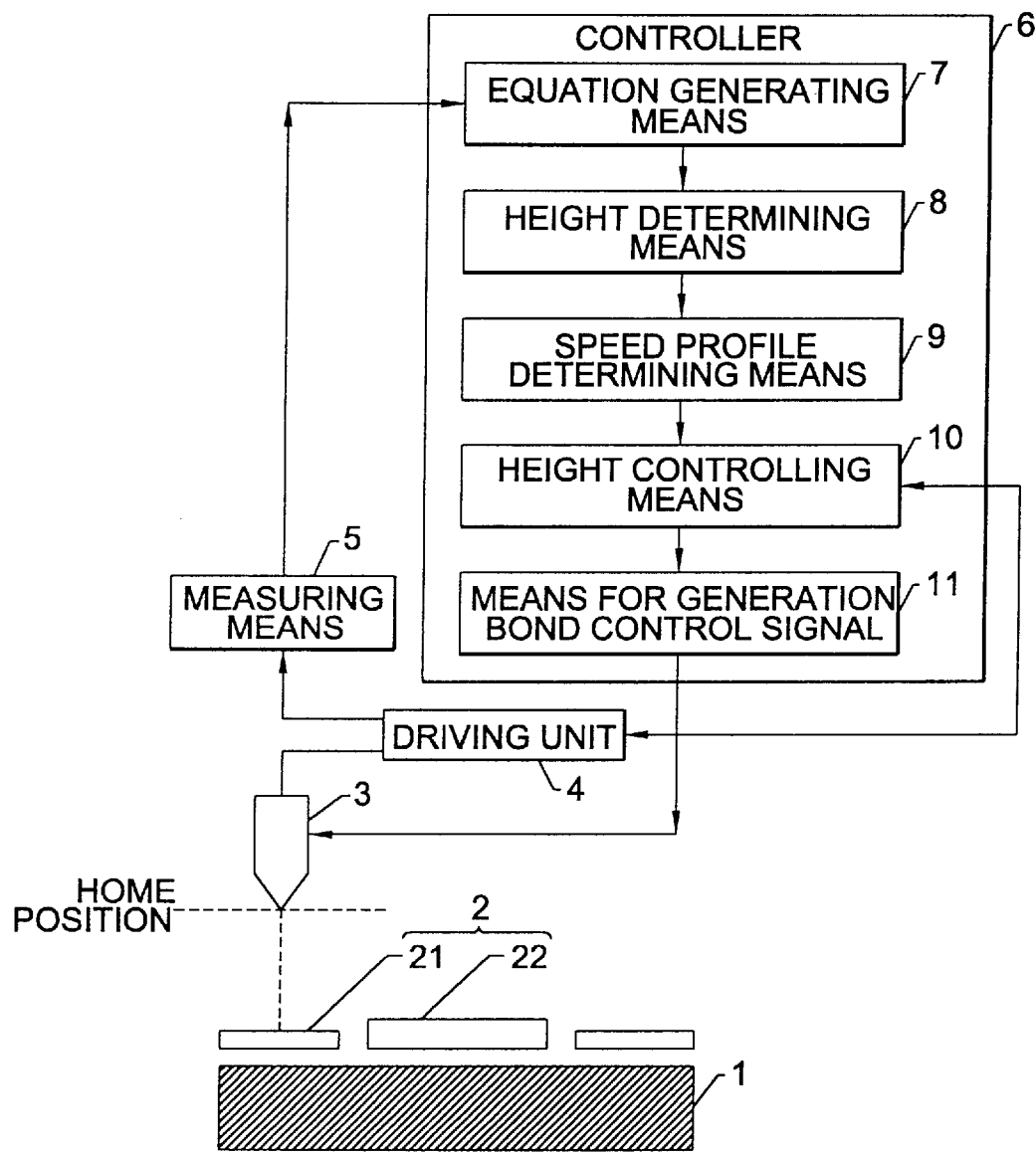
FIG. 1 is a block diagram of a wire bonding apparatus according to an embodiment of the present invention.

As shown in FIG. 1, a workpiece 2, consisting of electrical leads 21 of a lead frame and an IC 22, mounted upon the die pad unit of the lead frame are placed on a heater block 1 for performing the wire bonding operation. The upper surface of workpiece 2 defines a plane and has a plurality of bonding positions that are to be wire bonded. Located above the workpiece 2 is a wire bonding apparatus according to one embodiment of the present invention for creating a wire bond at the plurality of bond positions on the workpiece such that respective ones of the leads can be connected to respective pads of the IC.

The wire bonding apparatus of the present invention includes wire bonding means 3, such as a capillary, that is controllably positioned to contact the workpiece 2 at a plurality of bonding positions to form wire bonds. Although the wire bonding means is preferably embodied by a capillary, the wire bonding means could be embodied by any of a variety of devices which form a wire bond. FIG. 1 also illustrates a drive unit 4 that is connected to the wire bonding means 3 and that moves the wire bonding means 3 downwardly toward the workpiece. Although the drive unit is typically a stepper motor, the drive unit for moving the wire bonding means may be embodied by any position system without departing from the spirit and scope of the present invention. In this particular embodiment, measuring means 5 is also connected to the drive unit to measure the movement of the wire bonding means as described below.

The wire bonding apparatus further includes a controller 6 for controlling the drive unit 4 and the wire bonding means 3. In particular, the controller 6 includes equation generating means 7 which generates an equation that defines the geometric plane of the workpiece 2. The controller of the present invention also includes height determining means 8 that determines the difference in height between the initial or home position of the wire bonding means 3 and the workpiece 2 at each of a plurality of selected bonding positions. This height differential is determined by applying the coordinates of the bonding position to the equation generated by the equation determining means 7. Based on the height differential, a speed profile determining means 9 determines a speed profile for moving the wire bonding means 3 downward to each of the selected bonding positions. This speed profile includes a first and second section.

The controller 6 of the present invention also includes height controlling means 10 that controls the height or position of the wire bonding means by providing a first control signal to the drive unit 4 to move the wire bonding means 3 through the first section and provides a second control signal to the drive 4 to move the wire bonding means 3 through the second section. The controller 6 also includes means for generating a bond control signal 11 to the wire bonding means 3 such that once the wire bonding means 3 contacts the workpiece 2 at a bonding position a wire bonding operation is performed.

The controller and, more specifically, the equation generating means, height determining means, speed profile determining means, height controlling means, and the means for generating a bond control signal may be embodied either by a computer that operates under software control or by individual electronic devices. Although the above embodiment illustrates the wire bonding of an IC 22 to a lead frame 21, it must be understood that the wire bonding apparatus is not limited to semiconductor manufacturing and can be used in any particular application in which wire bonding is required. Further, it must understood that although the illustration depicts the wire bonding of an IC which has one level of input and output terminals, the wire bonding apparatus of the present invention could be used for any IC configuration.

As discussed previously, differences in height of individual bonding positions on a workpiece occur due to manufacturing tolerances, improper placement of the IC upon the die pad unit, and differences in height between the IC and the electrical leads. Conventional wire bonding systems, however, do not compensate for these differences. Instead, conventional systems utilize a standard acceleration/deceleration motion section for all bonding positions. Thus, the uniform motion section can vary in height between bonding positions so as to cause nonuniform wire bonding of the workpiece and, in some instances, to cause the capillary to become embedded in the workpiece thereby, damaging the wire bonding means and/or the workpiece.

As discussed above, the wire bonding apparatus of the present invention alleviates problems due to differences in height between the plurality of bonding positions of the workpiece by creating uniform search level heights (uniform motion sections) for all bonding positions. This uniformity is accomplished by the present invention by generating an equation of the plane of the workpiece. This equation is generated by using the coordinates of a plurality of bonding positions on the workpiece and the differences in height from the initial or home position of the wire bonding means to each of the bonding positions. This equation is based on a system of equations that are generated from the coordinates of these bonding positions. After the equation is generated, the controller can utilize the equation to mathematically determine the difference in height between the initial or home position of the wire bonding means and a selected bonding position by inputting the coordinates of the selected bonding position into the equation.

Figure 2:
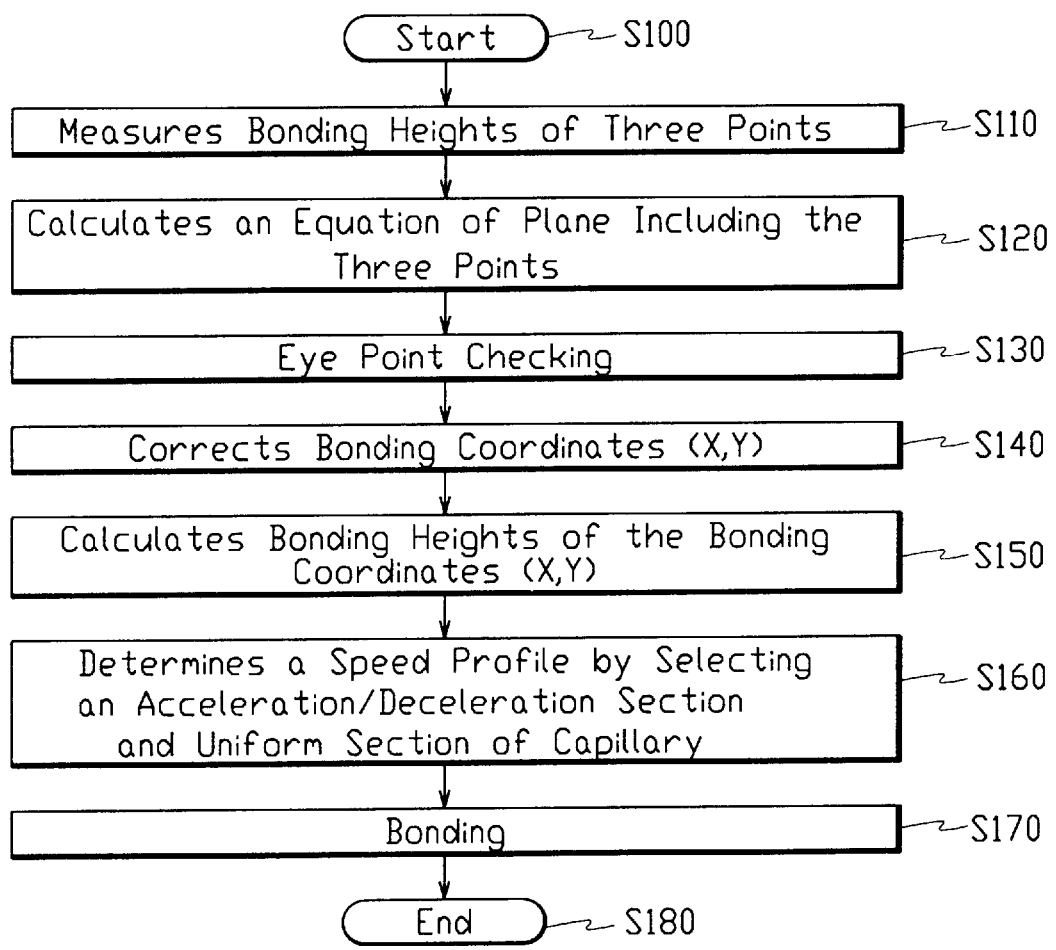
FIG. 2 is a flow chart of the operations performed by a wire bonding apparatus according to an embodiment of the present invention.
Figure 3:
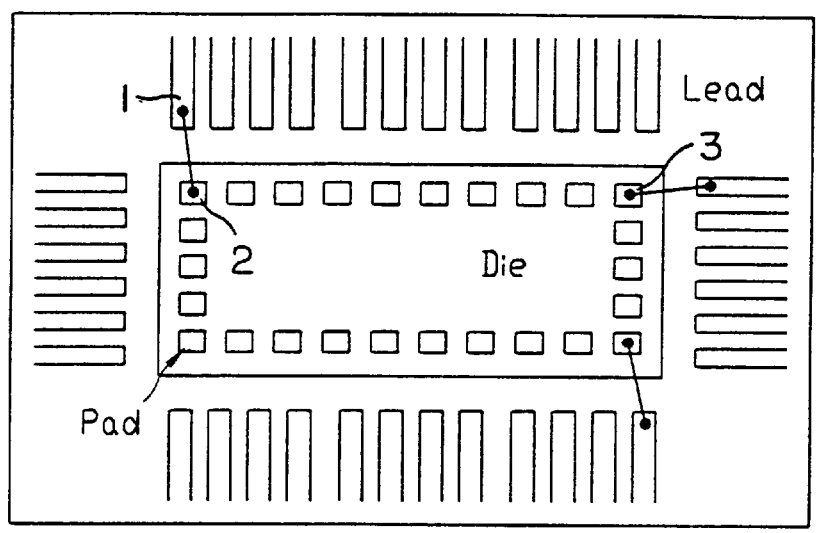
FIG. 3 illustrates a workpiece with a plurality of pads and leads, each of which defines a bonding position.

FIG. 2 illustrates the operations performed by the wire bonding apparatus according to one embodiment of the present invention when in conjunction with the workpiece 2 of FIG. 3 which includes a lead frame having a plurality of electrical leads 21 and an IC 22 presented thereupon. With reference to FIG. 2, the wire bonding apparatus of the present invention initially measures the bonding heights of a plurality of bonding positions (See step S110). These measurement positions may either be preselected or determined by the controller.

These measurements of the plurality of bonding positions are performed by measuring means 5, shown in FIG. 1, which measures the difference in height between the initial or home position of the wire bonding means and the workpiece at a plurality of measurement positions that have defined coordinates (x, y) on the workpiece. For example, FIG. 3 illustrates three measurement positions 1, 2, and 3 which have respective coordinates of $\{(x1, y1), (x2, y2), (x3, y3)\}$. However, the wire bonding method and apparatus of the present invention can make measurements at more than these positions if so desired.

To measure the difference in height at these three measurement positions, the height controlling means 8 controls the drive unit 4 to move the wire bonding means 3 downward toward each of the measurement positions. The measurement means 5 of the wire bonding apparatus measures the distance that the wire bonding means 3 travels downward before contacting each of the measurement positions.

These measurements represent the difference in height between the home position of the wire bonding means and the workpiece at each of the selected measurement positions. This measurement process is repeated for the remaining measurement positions. While the measuring means is typically an encoder, the measuring means can include any other measurement device, either analog or digital, that can measure the distance that the wire bonding means moves downward to contact a bonding position.

The difference in height between the initial position of the wire bonding means and the various bonding positions (1, 2, and 3) are all measured such that a z-coordinate can be determined for each of the bonding positions (1, 2, and 3). In other words, the measurement means generates the z-coordinate for the workpiece at each of the three bonding positions (1, 2, and 3).

As known to those skilled in the art, the equation for a plane is Ax+By+Cz+D=0 wherein A, B, C are constants to be determined as described below and D is a constant selectively chosen by the user. With reference to FIG. 3, after three dimensional coordinates {(x1, y1, z1), (x2, y2, z2), (x3, y3, z3)} corresponding to the three positions (1, 2, 3) are calculated as described above, the equation generating means determines an equation of a plane based upon the following three simultaneous equations, one of which is associated with each one of the three positions (1, 2, 3):

$$x1A+y1B+z1C+D=0$$

$$x2A+Y2B+z2C+D=0$$

$$x3A+y3B+z3C+D=0$$

By solving these three simultaneous equations for the constants A, B, and C, the equation of the plane can be expressed as z=f(x, y). Based upon the equation of the plane, the wire bonding apparatus and, more particularly, the equation generating means 7 calculates the difference in height between the initial or home position of the wire bonding means and any selected bonding position on the workpiece (See step S150). This calculation is accomplished by solving the equation of the plane using the (x, y) coordinates of the bonding position. In other words, each time a bonding position is input to the controller 6, the height determining means 8 determines the corresponding z-coordinate (the difference in height between the initial or home position of the wire bonding means and the bonding position) by applying the coordinates (x, y) corresponding to the inputted bonding position to the calculated equation of the plane.

In some embodiments of the present invention, it is desirable to correct the coordinates of a bonding position to be bonded. This correction is accomplished by an eye point searching means that searches for a specific part of the lead frame that serves as a reference point, such as an edge of the lead frame (See step S130). The wire bonding apparatus then corrects or standardizes the coordinates (x, y) of the bonding positions to the reference point on the lead frame. These corrected bonding coordinates (x, y) are then used by the determining means to calculate the height differential by applying the corrected coordinates to the equation (z=f(x, y)) in step S150.

With reference to step S160 in FIG. 3, after the wire bonding apparatus of the present invention determines the height differential between the wire bonding means and a specific bonding position, speed profile determining means 9 determines a speed profile for the downward movement of the wire bonding means 3 to the selected bonding position. The speed profile comprises first and second sections. In a particular embodiment, the first section is designated as an acceleration/deceleration motion section and the second section is designated as the uniform motion section (or search level). The speed profile determining means 9 of the present invention generally subtracts a uniform motion section (or search level) having a constant predetermined length from the height differential calculated by the height determining means 8 and designates the remainder as the acceleration/deceleration motion section. As such, the wire bonding apparatus of the present invention ensures that the uniform motion section for each bonding position will be the same. This requirement, in turn, allows for uniform application of the touch algorithm such that a uniform wire bond will be formed at each bonding position.

Finally, the height controlling means 10 provides a drive signal to the drive unit 4 to move the wire bonding means 3 through the acceleration/deceleration motion section with an acceleration/deceleration motion. After the wire bonding means 3 passes through the acceleration/deceleration motion section, the height controlling means 8 initiates the touch algorithm and provides a signal to the drive unit 4 to move the wire bonding means through the uniform motion section (or search level) with a uniform motion. When the wire bonding means 3 contacts the workpiece at the bonding position, the controller provides a signal to the wire bonding means to perform the wire bonding operation on the workpiece. (See step S170).

As an example of steps S150–S170 of the present invention, the following example is provided. In step S150 of FIG. 2, the height determining means 8 determines a bonding height value Za=3 mm that represents the height differential between the initial or home position of the wire bonding means and a selected bonding position. The uniform motion section (or search level) of this example is preselected to be Zb=2 mm. Thus, in step S160, the speed profile determining means 9 calculates the length of the acceleration/deceleration section (i.e., the distance from Za to Zb) as Za−Zb=1 mm.

In this example, after the relative lengths of the sections have been set, the height controlling means 10 activates the drive unit 4 to move the wire bonding means 3 with an acceleration/deceleration motion through the acceleration/deceleration motion section and thereafter generates a control signal for moving the wire bonding means at an uniform motion through the uniform motion section once the wire bonding means reaches the end of its acceleration/deceleration motion section.

In other words, the drive unit 4 of this example moves the wire bonding means 3 with an acceleration/deceleration motion for the first 1 mm from the initial or home position of the wire bonding means toward the workpiece. The drive unit 4 then moves the wire bonding means 3 with a uniform motion for the remaining 2 mm such that the wire bonding means 3 is ensured to contact, but not damage the workpiece 2. When the wire bonding means contacts the bonding position (a pad 22 or a lead 21) of the workpiece, the drive unit 4 ceases to move the wire bonding means and the controller 11 activates the wire bonding means, 3, such as a capillary to perform a wire bonding operation. (See step S170).

Figure 4:
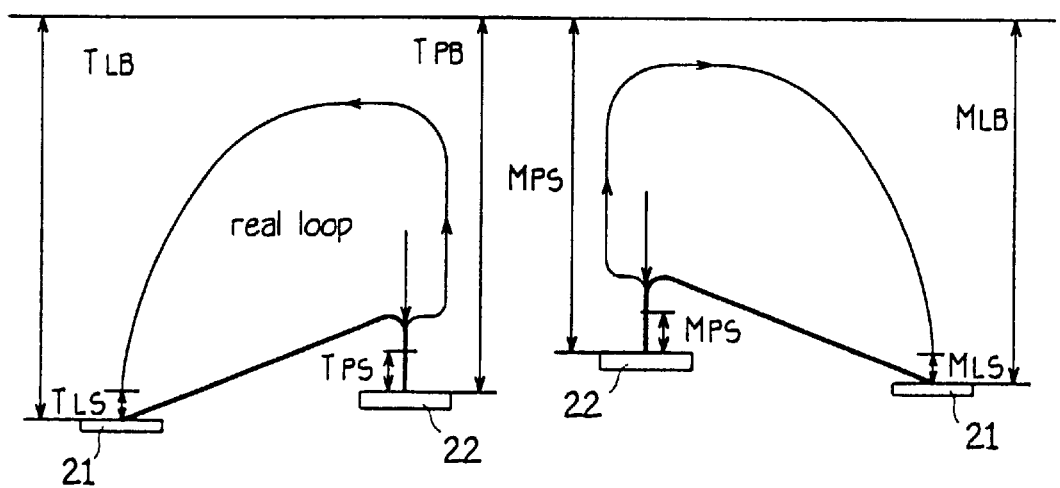
FIG. 4 illustrates the paths of travel for a capillary in performing two different wire bonding operations.
Figure 5:
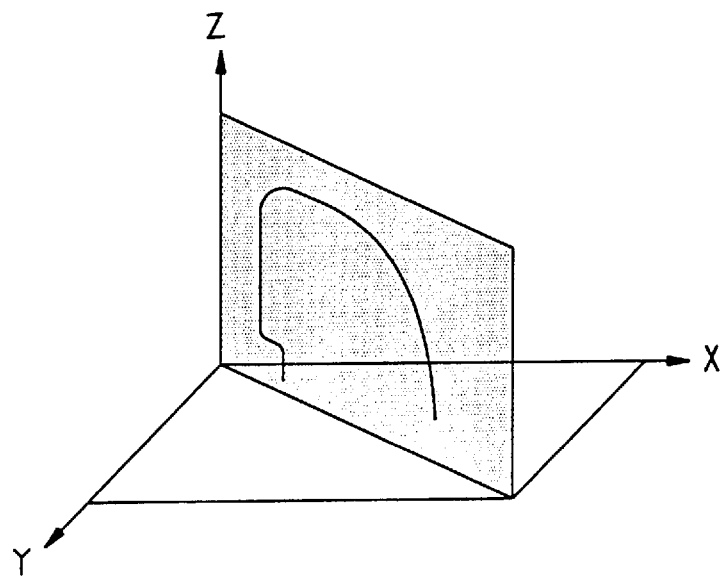
FIG. 5 is a three-dimensional representation of one of the paths of FIG. 4.
Figure 6:
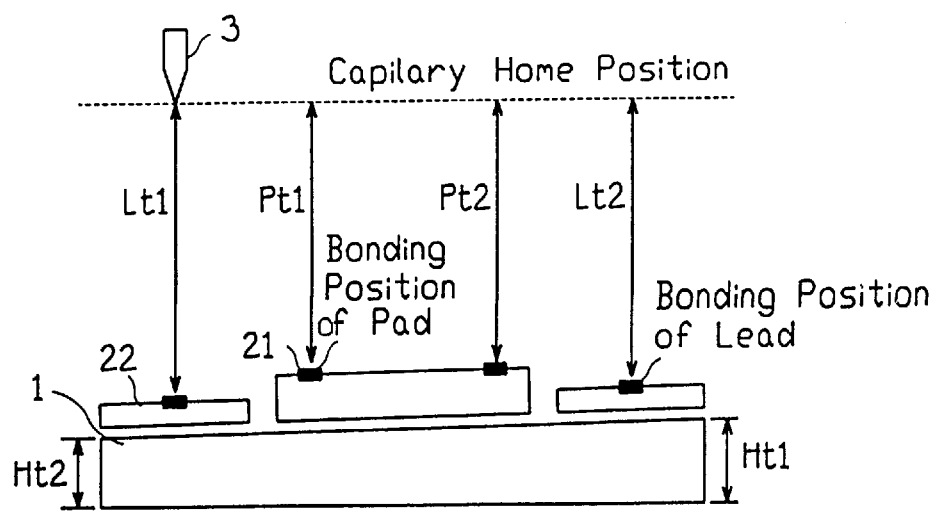
FIG. 6 shows differences in bonding heights caused by misalignment of the workpiece.
Figure 7:
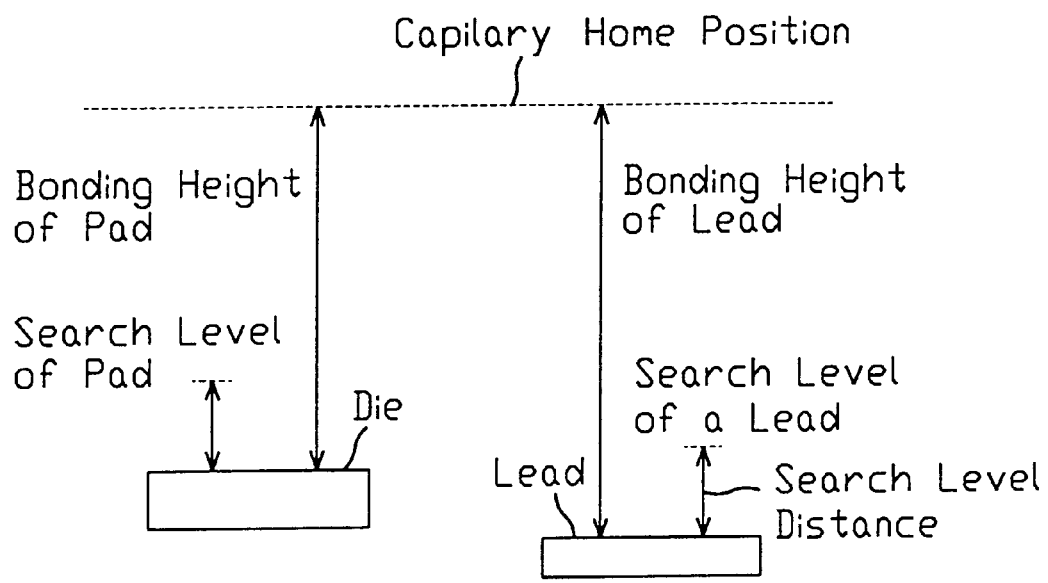
FIG. 7 illustrates the acceleration/deceleration motion region and the uniform motion region (or search level) during conventional wire bonding operations.

FIGS. 4 and 5 illustrate another example of the paths traced by a capillary to bond a pad to a lead even though the pad and the lead are at different heights. As shown in FIG. 4, the uniform motion section (search level) for each pad 22 is the same, i.e., TPS=MPS, even though the height differentials between the home position of the capillary and the respective pads 22 are different, i.e., TPB≈MPS. Likewise, the uniform motion section (search level) for each lead 21 is the same, i.e., TLS=MLS, even though the height differentials between the home position of the capillary and the respective leads are different. Thus, as illustrated in FIG. 4, the uniform motion sections for all the pads are preferably the same and the uniform motion sections for all the leads are preferably the same, but the uniform motion sections for the pads need not be the same as the uniform motion sections for the leads.

As described above, the present invention provides a wire bonding apparatus and method that calculates an equation of a plane including bonding positions of a workpiece to be wire-bonded and calculates bonding heights of bonding positions, thereby compensating for inaccuracies arising from installation errors or processing tolerances. Utilizing these calculated heights the wire bonding apparatus of the present invention performs a stable and uniform wire bond.

Further, the wire bonding apparatus and method of the present invention compensates for differences in position heights of the bonding positions and provides the same uniform motion section (or search level) for all bonding positions such that the wire bonding operation is uniform for all bonding positions. Further, by providing the same uniform motion section (or search level) for all bonding positions, the wire bonding apparatus and method of the present invention prevents damage to the wire bonding means, i.e., the capillary.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are not used in a generic and descriptive sense only and not for purposes of limitation.

That which is claimed is:

1. A wire bonding apparatus for performing a wire bond operation on a workpiece having a planar upper surface, wherein said apparatus comprises:

wire bonding means for forming a wire bond, said wire bonding means having a home position;

a drive unit for positioning the wire bonding means; and a controller for controlling the drive means and the wire bonding means, wherein said controller comprises:

equation generating means for generating an equation that defines the geometric plane of the upper surface of the workpiece;

height determining means for determining, based on said equation, a difference in height between the home position of said wire bonding means and said workpiece at a selected bonding position;

means for determining a speed profile of said wire bonding means according to said difference in height;

height controlling means for controlling the height of said wire bonding means, wherein said height controlling means provides control signals to said drive unit to sequentially move said wire bonding means through said speed profile such that said wire bonding means is moved to said bonding position with a desired motion; and means for generating a bond control signal and for providing the bond control signal to said wire bonding means such that said wire bonding means performs the wire bonding operation when said wire bonding means reaches the bonding position.

2. An apparatus according to claim 1, wherein said controller further comprises measuring means for measuring the difference in height between the home position of the wire bonding means and the workpiece at a plurality of measurement positions that have defined coordinates on said workpiece, and wherein said equation generating means generates said equation based on the coordinates and the corresponding differences in height measured by said measuring means.

3. An apparatus according to claim 2, wherein said height controlling means provides a control signal to said drive unit to move said wire bonding means to each of said measurement positions, and wherein said measuring means comprises an encoder for determining the difference in height between the home position of the wire bonding means and the workpiece at each measurement position by measuring the movement of said wire bonding means to the workpiece at each of said measurement positions.

4. An apparatus according to claim 1, wherein said speed profile comprises an acceleration/deceleration motion section and an uniform motion section such that said height controlling means provides a first control signal to said drive unit to move said wire bonding means through said acceleration/deceleration motion section with an acceleration/deceleration motion and provides a second control signal to said drive unit to move said wire bonding means through said uniform motion section with a uniform motion.

5. An apparatus according to claim 4, wherein said uniform motion section defines a selected distance directly above the bonding position, and wherein said acceleration/deceleration motion section defines the distance between the home position of said wire bonding means and the uniform motion section.

6. An apparatus according to claim 2, wherein at least three of the measurement positions have coordinates defining respective edges of the workpiece.

7. A wire bonding apparatus for performing a wire bonding operation on a workpiece having a planar upper surface, wherein said apparatus comprises:

wire bonding means for forming a wire bond, said wire bonding means having a home position;

a drive unit for positioning said wire bonding means; and a controller for controlling the drive unit during the wire bonding operation, wherein said controller comprises:

height determining means for determining a respective height between the home position of said wire bonding means and a selected bonding position on said workpiece;

means for determining a speed profile of said wire bonding means according to said height;

means for controlling the height of said wire bonding means, wherein said height controlling means provides control signals to said drive unit to sequentially move said wire bonding means through said speed profile such that said wire bonding means is moved to said bonding position with a desired motion; and means for generating a bond control signal and for providing the bond control signal to said wire bonding means such that said wire bonding means performs the wire bonding operation when said wire bonding means reaches the bonding position.

8. An apparatus according to claim 7 further comprising means for generating an equation that defines the geometric plane of the upper surface of the workpiece, and wherein said height determining means determines the difference in height between the home position of said capillary and each of said plurality of bonding positions based on said equation.

9. An apparatus according to claim 8, wherein said controller further comprises measuring means for measuring the difference in height between the home position of the capillary and the workpiece at a plurality of measurement positions that have defined coordinates on said workpiece, and wherein said equation generating means generates said equation based on the coordinates and the corresponding differences in height measured by said measuring means.

10. An apparatus according to claim 9, wherein said height controlling means provides a control signal to said drive unit to move said capillary to each of said measurement positions, and wherein said measuring means comprises an encoder for determining the difference in height between the home position of said capillary and each measurement position by measuring the movement of said capillary to the workpiece at each of said measurement positions.

11. An apparatus according to claim 7, wherein said speed profile comprises an acceleration/deceleration section and an uniform section such that said height controlling means provides a first control signal to said drive unit to move said capillary through said acceleration/deceleration motion section with an acceleration/deceleration motion and provides a second control signal to said drive unit to move said capillary through said uniform motion section with a uniform motion.

12. An apparatus according to claim 11, wherein said uniform section defines a selected distance directly above the bonding position, and wherein said acceleration/deceleration motion section defines the distance between the home position of said capillary and the uniform motion section.

13. An apparatus according to claim 9, wherein at least three of the measurement positions have coordinates defining respective edges of the workpiece.

14. An apparatus according to claim 7, wherein said wire bonding means comprises a capillary for forming a wire bond at a selected bonding position on said workpiece.

* * * * *

UNITED STATES PATENT AND TRADEMARK OFFICE
CERTIFICATE OF CORRECTION

PATENT NO.        : 6,059,168
APPLICATION NO. : 09/048543
DATED             : May 9, 2000
INVENTOR(S)      : Shin et al.

It is certified that error appears in the above-identified patent and that said Letters Patent is hereby corrected as shown below:

On Title page, item [54], line 1 and Column 1, line 1:

In the title, "BOND" should read --BONDING--.

Title Page, insert the following:

--Foreign Application Priority Data

March 28, 1997   Korea   97-11081--.

Column 9, line 41, "bond" should read --bonding--.

Signed and Sealed this

Thirty-first Day of July, 2007

JON W. DUDAS
*Director of the United States Patent and Trademark Office*